(12) United States Patent
Gustafsson

(10) Patent No.: US 11,722,157 B2
(45) Date of Patent: Aug. 8, 2023

(54) METHODS, COMPUTER PROGRAMS, DEVICES, AND ENCODERS FOR SIGNAL ERROR CORRECTION

(71) Applicant: LEINE & LINDE AB, Strängnäs (SE)

(72) Inventor: Fredrik Gustafsson, Strängnäs (SE)

(73) Assignee: LEINE & LINDE AB, Strängnäs (SE)

( * ) Notice: Subject to any disclaimer, the term of this patent is extended or adjusted under 35 U.S.C. 154(b) by 1122 days.

(21) Appl. No.: 16/261,145

(22) Filed: Jan. 29, 2019

(65) Prior Publication Data

US 2019/0238161 A1 Aug. 1, 2019

(30) Foreign Application Priority Data

Feb. 1, 2018 (SE) .................................... 1850118-9

(51) Int. Cl.
*H03M 13/00* (2006.01)
*H03M 13/31* (2006.01)
*G11B 20/18* (2006.01)
*G01D 5/244* (2006.01)
*G01D 5/245* (2006.01)

(52) U.S. Cl.
CPC ........ *H03M 13/31* (2013.01); *G01D 5/24471* (2013.01); *G01D 5/24495* (2013.01); *G11B 20/1833* (2013.01); *G01D 5/2451* (2013.01)

(58) Field of Classification Search
CPC .............. H03M 13/31; G01D 5/24471; G01D 5/24495; G01D 5/2451; G01D 18/00; G01D 5/24476; G01D 5/2454; G11B 20/1833; G01P 3/489
See application file for complete search history.

(56) References Cited

U.S. PATENT DOCUMENTS

| | | | | |
|---|---|---|---|---|
| 5,594,241 A | * | 1/1997 | Li | ......................... G01D 5/2448 250/231.17 |
| 6,084,369 A | * | 7/2000 | Breitling | .............. G01D 5/2451 200/574 |

(Continued)

FOREIGN PATENT DOCUMENTS

| | | | | |
|---|---|---|---|---|
| EP | 3040690 A1 | 7/2016 | | |
| JP | 2009508263 A | * | 9/2006 | ............. G05B 13/02 |
| JP | 2014-102136 A | 6/2014 | | |

OTHER PUBLICATIONS

EP 19 15 4835, Partial European Search Report dated Aug. 27, 2019 from the European Patent Office.

(Continued)

*Primary Examiner* — Albert Decady
*Assistant Examiner* — Osman M Alshack
(74) *Attorney, Agent, or Firm* — Carter, Deluca & Farrell LLP

(57) ABSTRACT

A method for signal error correction of a position signal relating to a relative position of at least one sensor with respect to a reference, includes determining a set of parameter values of a parameterized approximation of a corrected relative position with respect to time based on measurements of the position signal over a duration of at least one period of a periodic signal error of the position signal. The method further includes estimating a first corrected relative position at a first time based on the parameterized approximation using the determined set of parameter values and the first time.

21 Claims, 5 Drawing Sheets

(56) References Cited

U.S. PATENT DOCUMENTS

| | | | | |
|---|---|---|---|---|
| 6,304,825 | B1* | 10/2001 | Nowak | G03G 21/145 |
| | | | | 399/167 |
| 2005/0179429 | A1* | 8/2005 | Lohberg | G01P 3/489 |
| | | | | 324/207.13 |
| 2009/0259918 | A1* | 10/2009 | Sugie | G01D 5/2449 |
| | | | | 714/764 |
| 2010/0303460 | A1* | 12/2010 | Hunter | G01D 5/24419 |
| | | | | 398/25 |
| 2011/0144940 | A1* | 6/2011 | Zachow | G01D 5/24461 |
| | | | | 324/207.25 |
| 2013/0038490 | A1* | 2/2013 | Garcia | G01S 13/74 |
| | | | | 342/451 |
| 2013/0261964 | A1* | 10/2013 | Goldman | G01C 21/1654 |
| | | | | 324/207.13 |
| 2014/0066884 | A1* | 3/2014 | Keenan | A61M 5/1723 |
| | | | | 604/504 |
| 2014/0126677 | A1* | 5/2014 | Fritsch | G01D 21/02 |
| | | | | 375/362 |
| 2015/0355010 | A1* | 12/2015 | Deak | G01F 15/066 |
| | | | | 324/207.21 |
| 2015/0362347 | A1 | 12/2015 | Park et al. | |
| 2016/0138942 | A1* | 5/2016 | Takahashi | G01D 5/249 |
| | | | | 324/207.12 |

OTHER PUBLICATIONS

Swedish Search Report issued in SE Patent Application No. 1850118-9, dated Oct. 22, 2018, pp. 1-3.

Sartori, S. et al., "Geometric Error Measurement and Compensation of Machines" Annals of the CIRP (1995) pp. 599-609, vol. 44, No. 2.

Aksenenko, V. D. et al., "Linear and Angular Measurements: A New Generation of Precision Angle Digitizers" Measurement Techniques (Jun. 2013) pp. 252-258, vol. 56, No. 3.

Aksenenko, V. D. et al., "Digital Angle Sensor Self-Calibration: Two Approaches to Accuracy Increasing" IMTC 2005—Instrumentation and Measurement Technology Conference (May 2005) pp. 543-547, vol. 1.

Fines, J. M. et al., "Machine tool positioning error compensation using artificial neural networks" Engineering Applications of Artificial Intelligence (Oct. 2008) pp. 1013-1026, vol. 21, Issue 7.

* cited by examiner

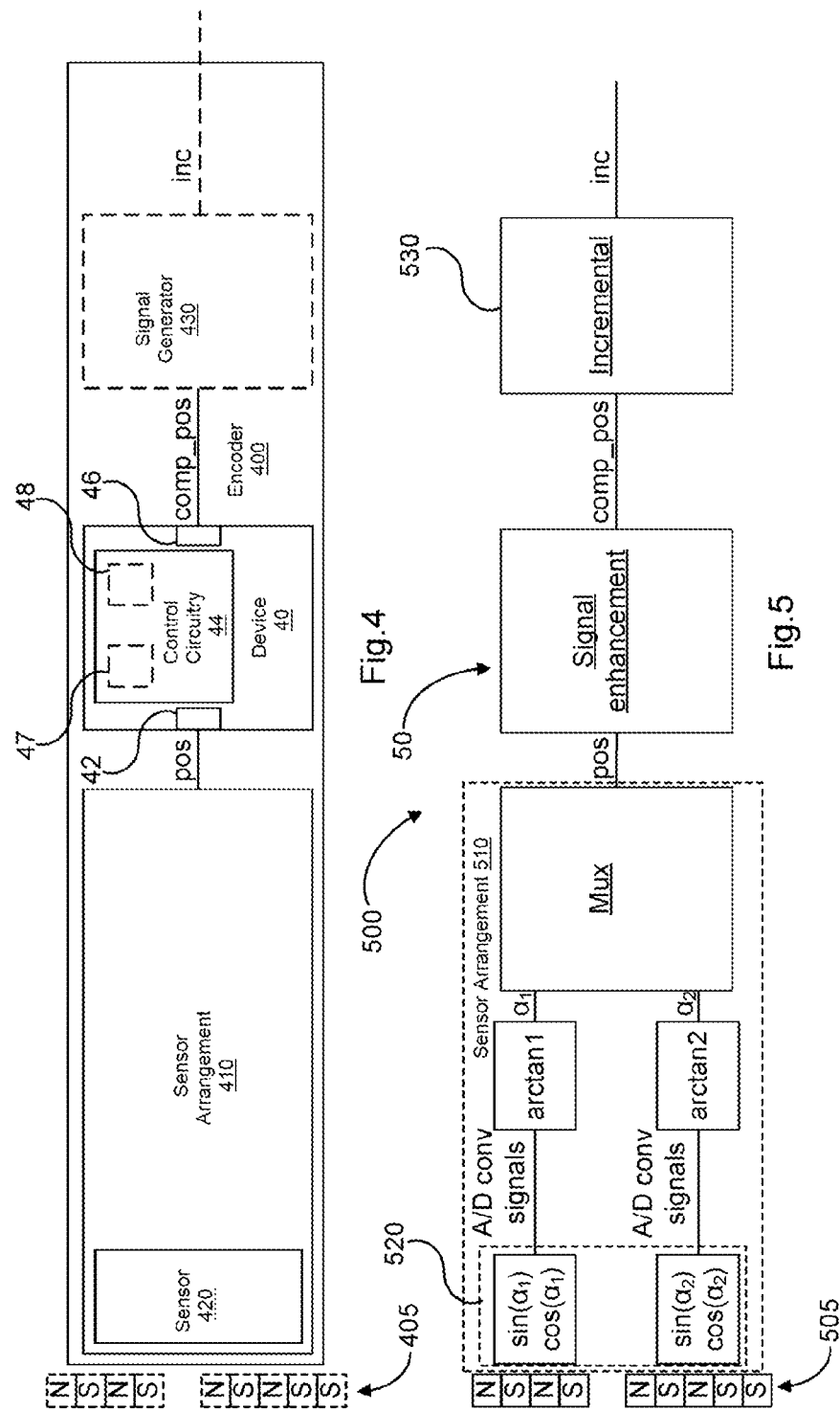

METHODS, COMPUTER PROGRAMS, DEVICES, AND ENCODERS FOR SIGNAL ERROR CORRECTION

CROSS-REFERENCE TO RELATED APPLICATIONS

The present application claims priority to Application No. 1850118-9, filed in the Swedish Patent and Registration Office on Feb. 1, 2018, which is expressly incorporated herein in its entirety by reference thereto.

FIELD OF THE INVENTION

The present invention relates to signal error correction. In particular, the present invention relates to a method for signal error correction of a position signal relating to a relative position of at least one sensor with respect to a reference. The present invention also relates to corresponding computer programs, devices, and encoders.

BACKGROUND INFORMATION

Much machine operation relies on registering information relating to a current machine status and using the registered information to either correct the operation of the machine or control downstream functions. Encoders are often used to register the relevant information and translate the information to suitable signals, such as incremental control signals. However, the signals measured by the encoders may be subject to perturbations caused by imperfectly aligned machine parts, e.g., due to fatigue, or external fields interfering with the measurement sensors of the encoders. Such perturbations may lead to imperfect measurements which, if not properly compensated for, will lead to downstream inefficiencies when used, e.g., when generating incremental control signals. There is thus believed to be a need for signal error correction, particularly signal error correction which may be used in encoders, such as incremental encoders.

SUMMARY

Example embodiments of the present invention provide for correction of periodic signal errors using knowledge of how an ideal signal is expected to behave.

According to an example embodiment of the present invention, a method for signal error correction of a position signal relating to a relative position of at least one sensor with respect to a reference, includes determining a set of parameter values of a parameterized approximation of a corrected relative position with respect to time based on measurements of the position signal over a duration of at least one period of a periodic signal error of the position signal. The method further includes estimating a first corrected relative position at a first time based on the parameterized approximation using the determined set of parameter values and the first time. The method thereby provides for significant reduction of periodic errors associated with determining a position with respect to a reference, such as detection of rotational movement of a rotatable shaft in relation to a part of a machine. An output signal based on the estimated corrected position will have a more stable frequency than an output signal based on a corresponding uncorrected position.

The first time may include a current time, and estimating the corrected position may include interpolating the corrected relative position based on the determined set of parameter values. Interpolating provides for generating a corrected position within a range in which the set of parameter values of a parameterized approximation. Use of a current time provides for estimating the corrected position at the current time. A corrected position estimated at the current time is typically more accurate than a position estimated at a previous time. The current time may include a last recorded time with respect to a time at which a step of the method was initiated. The current time may include a future time with respect to a time at which a step of the method was initiated.

The method may further include storing a set of time stamped relative positions with respect to the reference over a duration of at least one period of the periodic signal error. The stored set of time stamped relative positions provides for interpolation or regression based on measured position data points to match an expected behavior of positional change with respect to time, such as following a periodic motion.

The method may include updating the stored set of time stamped relative positions based on a moving time window, in which the time window has a width corresponding to the duration of the at least one period of the periodic signal error. By updating the stored set of time stamped relative positions, interpolation or regression based on the stored set of time stamped relative positions can also be updated as new relative position values are added and old relative position values are removed. The determined parameter values can thus be updated as the time window moves, i.e., the determined set of parameter values can be kept current with respect to current conditions.

The parametrized approximation may include a linear relationship of the corrected relative position with respect to a time. The linear relationship may be determined by a sum of an initial relative position, $s_0$, at an initial zero time, and a product of an average speed, v, of the relative position at the second time, t, and the second time, t, $s=s_0+v \cdot t$. A linear relationship requires the smallest amount of time stamped positions and thus offers the most computationally efficient implementation. A linear relationship typically offers a sufficiently accurate description of the time dependence of the position in order to reduce the associated periodic error, while providing the possibility to add nonlinear correction terms when needed.

Determining the set of parameter values may be performed using regression.

The method may further include outputting a compensated signal relating to the first corrected relative position. The output compensated signal may be used in downstream functions to generate more accurate control signals, such as incremental signals. The method may also include generating an incremental signal based on the compensated signal.

The method may further include evaluating a change of the relative position with a predetermined criterion. The comparison with the predetermined criterion provides for identifying situations where adjustments of the determination of the set of parameters can be improved. Evaluating the change of the relative position with a predetermined criterion further provides for switching the output of a signal relating to an estimated corrected relative position on and off depending on how circumstances change, in particular changes in the difference between the corrected relative position with an uncorrected relative position, a speed, or an acceleration.

The predetermined criterion may include a difference between the estimated first corrected relative position at the first time and a corresponding uncorrected relative position at the first time exceeding or falling below a predetermined threshold. The predetermined criterion may include a speed exceeding or falling below a predetermined threshold. The predetermined criterion may include an acceleration exceeding or falling below a predetermined threshold. Thresholds for speeds and/or acceleration provide for handling starts, stops, and changes of direction of the relative position. A speed threshold may further provide for handling uneven distributions of time stamped relative positions due to high speeds.

Estimating a first corrected relative position at a first time may include forming a weighted average of a set of previous speeds relating to a change of the relative position of the at least one sensor with respect to the reference and a current speed relating to a change of the relative position of the at least one sensor with respect to the reference. In certain scenarios, the measurement error is not harmonic. For example, due to air gaps between ring segments of a magnetic ring encoder, MRI, the MRI may have two sensors. When switching between the sensors, the phase of the interpolation changes abruptly. One manner of compensating for, i.e., reducing, such a non-harmonic disturbance is to calculate a weighted average of the old and the new speed, with emphasis on the old speed value. In other words, forming the weighted average provides for applying the method also to scenarios in which the measurement error is nearly harmonic; the weighted average provides for a reduction of the non-harmonic error contribution.

According to an example embodiment of the present invention, a computer program for signal error correction of a position signal relating to a relative position of at least one sensor with respect to a reference, includes computer program code which, when executed in a processor, causes the processor to carry out the method for signal error correction of a position signal relating to a relative position of at least one sensor with respect to a reference. The computer program implements the method and provides the technical effects and advantages of the method.

According to an example embodiment of the present invention, a device for signal error correction of a position signal relating to a relative position of at least one sensor with respect to a reference, includes an input signal interface configured to receive the position signal from the sensor arrangement. The device further includes control circuitry configured to determine a set of parameter values of a parameterized approximation of a corrected relative position with respect to time based on measurements of the position signal over a duration of at least one period of a periodic signal error of the position signal. The control circuitry is further configured to estimate a first corrected relative position at a first time based on the parameterized approximation using the determined set of parameter values and the first time. The device also includes an output signal interface configured to output a compensated signal relating to the first corrected relative position.

The control circuitry may include a processor and a memory. The memory has a computer program for signal error correction of a position signal relating to a relative position of at least one sensor with respect to a reference, as disclosed herein, stored thereon. The processor is configured to execute the computer program stored on the memory.

The device may be configured to perform the method and may provide the technical effects and advantages of the method.

According to an example embodiment of the present invention, an encoder for signal error correction of a position signal relating to a relative position of at least one sensor with respect to a reference, includes a sensor arrangement having at least one sensor. The sensor arrangement is configured to measure, by the at least one sensor (420, 520), the relative position. The sensor arrangement is further configured to output the position signal (pos) based on the measured relative position. The encoder further includes a device for signal error correction of the position signal. The device includes an input signal interface configured to receive the position signal from the sensor arrangement. The device further includes control circuitry. The control circuitry is configured to determine a set of parameter values of a parameterized approximation of a corrected relative position with respect to time based on measurements of the position signal over a duration of at least one period of a periodic signal error of the position signal. The control circuitry is further configured to estimate a first corrected relative position at a first time based on the parameterized approximation using the determined set of parameter values and the first time. The encoder further includes an output signal interface configured to output a compensated signal relating to the first corrected relative position.

The encoder may be configured to perform the method for signal error correction of a position signal relating to a relative position of at least one sensor with respect to a reference and may provide the technical effects and advantages of the method.

The parametrized approximation may include a linear relationship of the corrected relative position with respect to a second time.

The linear relationship may be determined by a sum of an initial relative position, $s_0$, at an initial zero time, and a product of an average speed, v, of the relative position at the second time, t, and the second time, $s=s_0+v \cdot t$.

The encoder may further include a signal generator configured to receive the compensated signal from the device for signal error correction. The signal generator if further configured to generate an incremental output signal based on the received compensated signal. The signal generator is also configured to output the generated incremental output signal. The encoder is thereby configured to use the error corrected position signal for use as a reference or active feedback control, thereby providing for the encoder to serve as a transducer.

BRIEF DESCRIPTION OF THE DRAWINGS

FIG. 1b illustrates a periodic signal error of the method illustrated in FIG. 1a.

FIG. 4 illustrates an encoder for signal error correction.

FIG. 5 illustrates examples of encoders for signal error correction.

DETAILED DESCRIPTION

The method described herein makes use of the fact that in many real-world scenarios a generated motion has a well-known behavior and a signal measuring a position with respect to a reference will be expected to exhibit certain characteristics depending on the motion to which the position relates. For example, in a case of a motion of constant speed, a speed-time relationship is expected to display a constant behavior, i.e., the speed will be constant with respect to time. Likewise, the position will be expected to change linearly. Deviations from these expected behaviors may in certain circumstances be considered as errors. In particular, periodic deviations from the expected behaviors can typically be interpreted as errors, and by determining these errors, the effect of these errors can be accounted for.

Figure 1A:
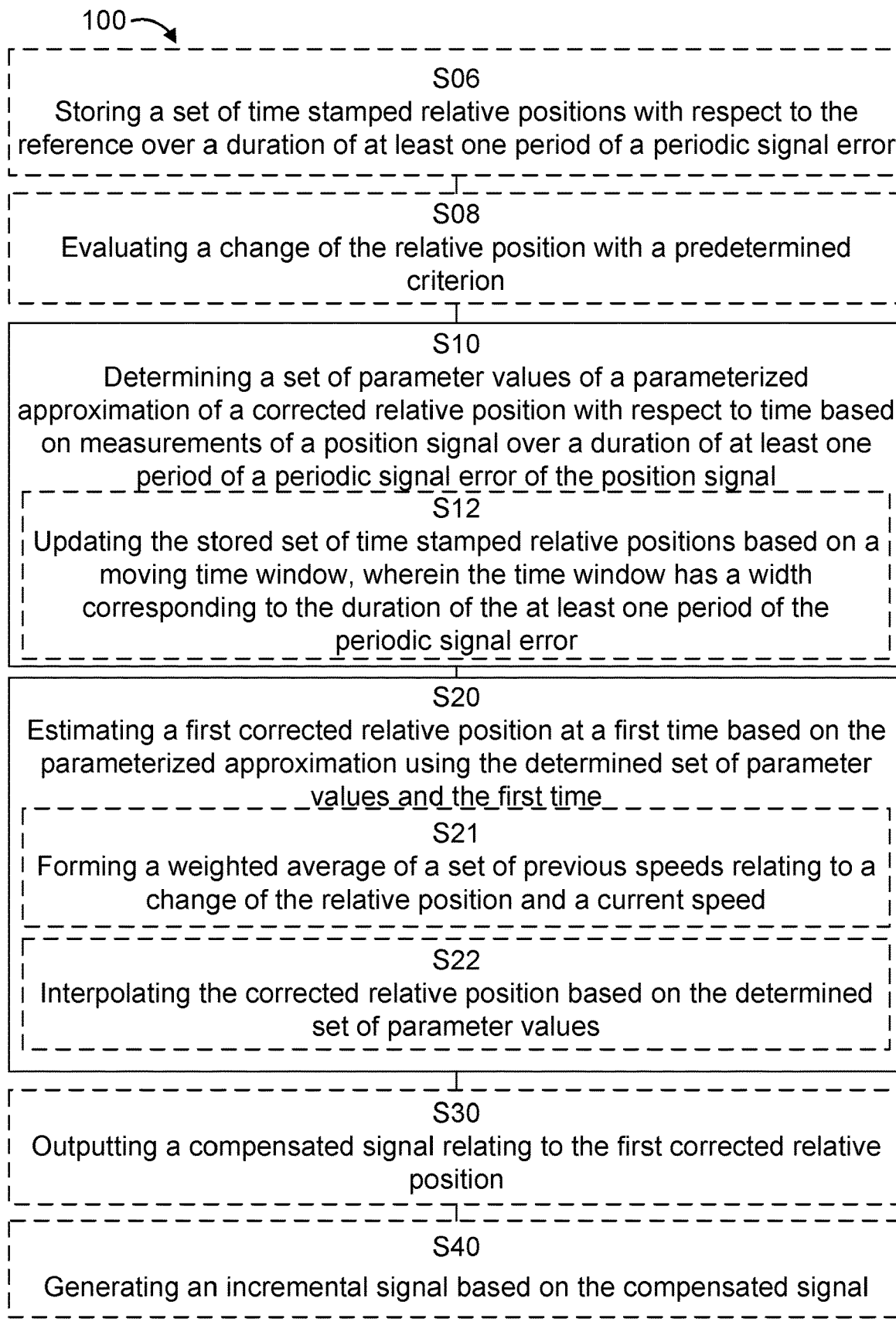
FIG. 1a illustrates method steps of a method for signal error correction.
Figure 1B:
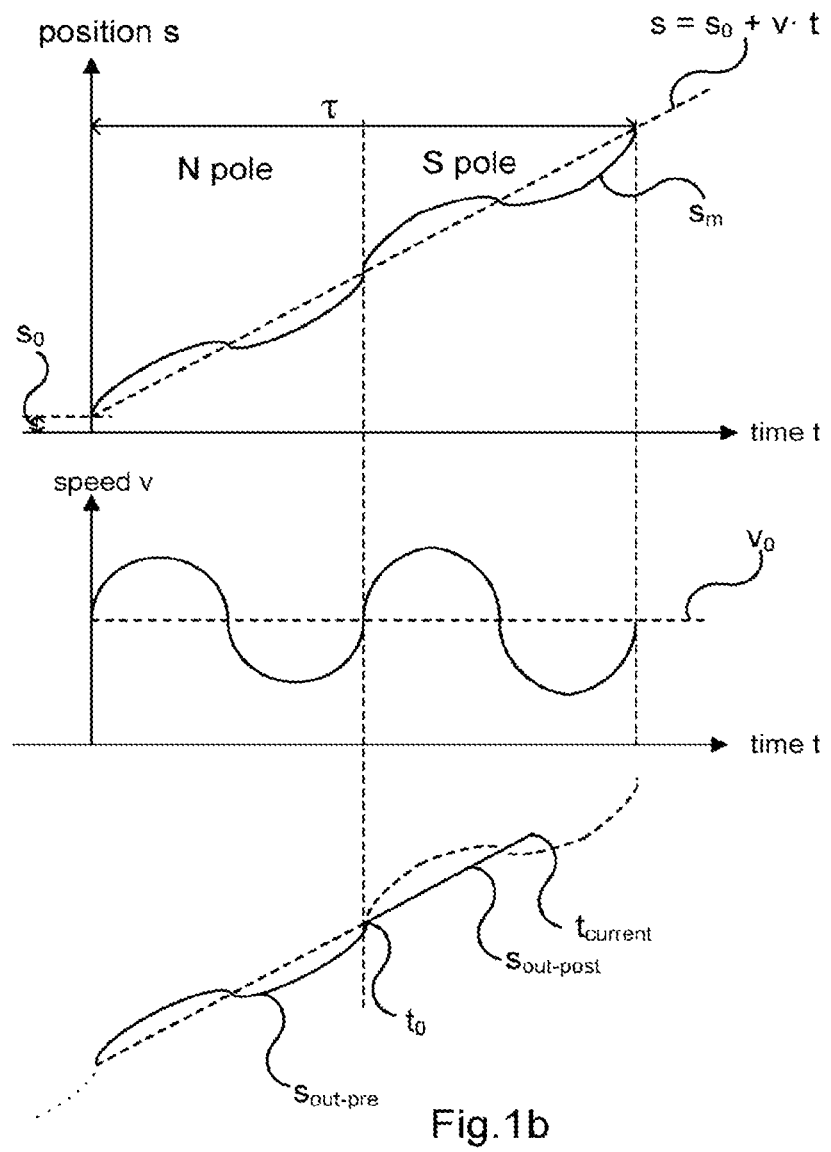

FIG. 1a illustrates method steps of a method 100 for signal error correction of a position signal relating to a relative position of at least one sensor with respect to a reference. FIG. 1b illustrates an example periodic signal error of FIG. 1a relating to magnetic ring encoder subject to a constant external magnetic field. The method includes determining S10 a set of parameter values of a parameterized approximation of a corrected relative position with respect to time based on measurements of the position signal over a duration of at least one period of a periodic signal error of the position signal. Once the parametrized approximation has been decided on, the parameter values that give the best fit of the parametrized approximation to a current set of conditions can be decided. According to some aspects, a table is generated by filling in a set of measured position values, e.g., evenly distributed, and a set of time values corresponding to when the position values were measured. By position values is meant measured signal values of the position signal. The pairs of position values and corresponding time values can be seen as a set of time stamped positions. In other words, the method may include storing a set of time stamped relative positions. The set of time stamped relative positions provide for curve fitting of the parametrized approximation using the set of time stamped relative positions in order to determine the set of parameter values for a current situation.

In the case of a magnetic ring encoder, the magnetic ring may serve as a reference. The magnetic ring of the magnetic ring encoder includes alternating magnetic north and south poles. The north and south poles may be detected and distinguished by a magnetic sensor, such as a Hall sensor. Thus, an arbitrarily chosen north or south pole may be defined as an initial position to which measured changes in the magnetic field can be interpreted as a corresponding change in position with respect to the arbitrarily chosen magnetic pole. Thus, the magnetic ring, or a magnetic pole of the magnetic ring, may be defined as a reference. When the magnetic ring rotates with respect to the magnetic sensor, the magnetic signal measured by the magnetic sensor changes as the magnetic sensor is moved with respect to subsequent magnetic north and south poles. The subsequent magnetic north and south poles represent positional changes with respect to the arbitrarily chosen magnetic north or south pole defining the initial position. The position measured by the magnetic sensor is thus a relative position of the sensor with respect to the reference.

If there are periodic deviations from the expected behavior, e.g., as exemplified above for a case of constant speed, the periodic deviations can typically be interpreted as periodic errors. Thus, the stored set of time stamped relative positions with respect to the reference may be stored over a duration of at least one period of the periodic signal error.

The stored set of time stamped relative positions may be generated dynamically, i.e., the size of the set may grow dynamically, e.g., by adding time stamped relative position measurement points at set time intervals to the set of time stamped relative positions. The set of parameters $s_0$, v, of the parametrized approximation that are being determined, can then be gradually updated as new time stamped relative position measurement points are being added. The parametrized approximation can then be interpolated for the duration of the stored set of time stamped relative positions. The interpolated values can be compared to the raw data of the measurement points in order to determine if there is a periodic error and, if so, the duration of a period of the periodic error.

If the motion to which the position of the at least one sensor with respect to the reference has a well-known periodic or nearly periodic character, the knowledge of the character of the periodic motion of the relative position with respect to the reference can be used to determine a suitable size of the set of time stamped relative positions to be stored in advance of storing the time stamped relative positions.

For instance, for a magnetic ring encoder, in which the reference includes a magnetic scale with a predetermined pole pitch, i.e., a predetermined distance between the center of adjacent north and south poles, a pair of north and south poles may be divided into a set of N−1 segment, resulting in a table of N evenly distributed time stamped relative position values. If there is a periodic error in the signal relating to the position with respect to the magnetic scale, it will be expected to repeat every time a pole on the magnetic scale has been passed, i.e., the error will appear over a duration corresponding to moving the position across a pole. In other words, the duration of one period of the periodic signal error may correspond to the duration required to move the position with respect to the magnetic scale across a pole.

Thus, in this example, storing the set of time stamped relative positions with respect to the magnetic scale over a duration required to move the position with respect to the magnetic scale across a pair of north and south poles corresponds to storing the set of time stamped positions with respect to the magnetic scale over a duration of two periods of the periodic signal error, e.g., one period over a north pole and one period over a south pole. It is also possible to store a set of time stamped relative positions with respect to the magnetic scale over a duration of one period of the signal error. However, the illustrated example of storing a set of time stamped relative positions with respect to the magnetic scale over a duration of two periods of the signal error may be able to provide a more accurate determination of the set of parameter values than a corresponding a set of time stamped relative positions stored over a duration of only one period of the periodic signal error. In the case of an external magnetic field affecting the magnetic signals, the signal at a north pole is affected in a different manner than at a south pole. But for each pole pair the pattern repeats itself, if the external magnetic field can be seen as constant over the magnetic pole pair. Thus, depending the source of error and/or on how the signal error is measured, the periodicity of the signal error may be seen as being periodic over one magnetic pole or over two magnetic poles.

Thus, in the illustrated example, the temporally first and last table entries are two periods of the periodic signal error apart.

In other words, according to some aspects, the method further includes storing S06 a set of time stamped relative positions with respect to the reference over a duration of at least one period of the periodic signal error.

According to some aspects, the method further includes updating S12 the stored set of time stamped relative positions based on a moving time window, wherein the time window has a width corresponding to the duration of the at least one period of the periodic signal error. In the example above, when the magnetic ring encoder has rotated a distance of twice the period of the periodic signal error divided by the number of segments, N−1, i.e., a step, the table is updated such that it is shifted one step forward like a moving window with the size of one pole pair.

According to some aspects, the parametrized approximation includes a linear relationship of the corrected relative position, s, with respect to a second time, t.

In other words, the position with respect to the reference includes an expression as described in equation (1) below:

$$s = s_0 + v \cdot t \qquad (1)$$

in which s denotes the corrected relative position at the second time t, $s_0$ denotes an initial position with respect to the reference, and v denotes an average speed at the second time t. The parametrized approximation for the position s is thus the expression on the right-hand side of equation (1). The set of parameter values that are determined S10 includes the initial position, $s_0$, and the average speed, v, at the second time.

This is further illustrated in FIG. 1b. The measurement of the position signal relating to the position of the at least one sensor with respect to the reference results in a measured position, $s_m$, which can be seen oscillating periodically with respect to time over respective magnetic poles in the top of FIG. 1b. A corresponding speed versus time graph is also illustrated in the middle of FIG. 1b. In an example in which a constant external magnetic field is affecting the magnetic signals relating to the position with respect to the reference, the magnetic signal at a north pole is affected in a different manner than at a south pole. For illustrative purposes, the position and speed error oscillations are over the magnetic south pole are illustrated as being greater than those over the magnetic north pole. In other words, the measurement error of the position will be different over magnetic north and south poles. Thus, the magnetic north poles will exhibit a first periodic error and the magnetic south poles will exhibit a second periodic error, the first and second periodic error having a total error pattern over a magnetic pole pair of north and south poles. Thus, the error pattern will repeat itself over a magnetic pole pair.

When the stored set of time stamped positions span a distance of a magnetic pole pair, here illustrated as a duration of two periods of the signal error, one period over a magnetic north pole and one period over a magnetic south pole, the stored set of time stamped positions can be used to determine the parameterized approximation of the position with respect to time, here illustrated as the linear relationship given by equation (1) above.

The straight line represents interpolated error corrected values of the position with respect to the reference. In other words, the parametrized approximation can be used to provide a corrected position with respect to the reference by inserting different values of the time t into equation (1). The bottom of FIG. 1b illustrates how the transition to a step of outputting S30 a compensated signal relating to the estimated first corrected relative position with respect to the reference will manifest itself. Up to an initial time, t0, the method has stored sufficient time stamped positions to determine the set of parameters $s_0$ and v of equation (1). During the time leading up to the initial time the measured raw data, i.e., the signal relating to the position with respect to the reference, $s_{out\text{-}pre}$, is output without any error correction. At the initial time the parametrized approximation is with the determined parameters in order to interpolate error corrected values of the position with respect to the reference, $s_{out\text{-}post}$, which is used in the step of outputting S30 a signal relating to the estimated corrected position with respect to the reference. The output signal relating to the estimated corrected position with respect to the reference will be continuously output using interpolated values of a current time, in which the current time refers to a last recorded time value or a future time. The future time may relate to a time step corresponding to a sampling frequency of the position signal measurement. In other words, the current time may include a last recorded time with respect to a time at which a step of the method was initiated. The current time may include a future time with respect to a time at which a step of the method was initiated.

In FIG. 1b, the transition is illustrated to occur when the measured raw data matches an interpolated value at a corresponding time. In practice, the time when the set of parameter values are determined may not coincide with a time when the measured raw data matches an interpolated value at a corresponding time. Thus, according to same aspects, the method includes waiting until the measured raw data matches an interpolated value at a corresponding time, which has the advantage of avoiding sudden jumps in the estimated position with respect to the reference.

This is further illustrated below.

The parametrized approximation may also be extended to include both other linear and nonlinear terms, as exemplified in equations (2) and (3) below:

$$s = s_0 + v \cdot t + \frac{a \cdot t^2}{2} \qquad (2)$$

$$s = s_0 + v \cdot t + b_1 \cdot \sin(t) + b_2 \cdot \cos(t) + \ldots \qquad (3)$$

Equation (2) includes an acceleration term, which may provide an improved fit to situations where the position changes rapidly with respect to the reference, thereby reducing associated lag. Equation (3) adds harmonic functions, which may be useful if the determination of the parameter values is performed by using the method of least squares. According to a preferred aspect, only the straight line part is used, i.e., $s = s_0 + v \cdot t$, when determining the error corrected signal, which will depend on s rather than the raw data from which s is determined.

According to some aspects, determining S10 the set of parameter values is performed using regression. Regression can typically be easily implemented and may provide implementations that have low computational demands. For instance, in equation (1), the parameters $s_0$ and v may be determined by using linear regression. In equation (3), the parameters $s_0$ and v may be determined by using the method of least squares.

According to some aspects, the method includes changing the parametrized approximation. According to some further aspects, the set of time stamped positions may be expanded and/or contracted based a predetermined set size criterion. For example, the parametrized approximation of equation (1) requires fewer time stamped positions than the parametrized approximation of equation (2). Thus, if the predetermined set size criterion indicates that it is desirable to change the parametrized approximation, e.g., from equation (1) to equation (2), the stored set of time stamped positions may be expanded accordingly to meet the need for additional time stamped positions. Likewise, the size of the set of time stamped positions may be reduced, i.e. contracted, accordingly if opposite situations arise.

Once the set of parameter values of the parametrized approximation have been determined, the parametrized approximation may be used to estimate, e.g., by using interpolation, an error-corrected value for the position with respect to the reference. Thus, the method further includes estimating S20 a first corrected relative position at a first time based on the parameterized approximation using the determined set of parameter values.

It may be desirable to filter the value of the speed, v, in equations (1) to (3). Returning to the example of the magnetic ring encoder, there is often one or more gaps in the magnetic scale, e.g., in order to make the magnetic scale dividable. In some examples, the magnetic ring encoder has at least two sensors, which are spatially offset such that when one sensor is measuring in a gap, the other sensor is measuring over the magnetic scale. Because of the gaps, the phase of the interpolation may change abruptly when switching between the sensors. Therefore, the measurement error may not appear completely periodic when passing a gap. A simple manner of filter the value of the speed, v, is to calculate the speed as a weighted average between an old value of the speed and a speed calculated over the last pole pair, ds/dt.

Thus, according to some aspects, estimating S20 a corrected relative position comprises forming S21 a weighted average of a set of previous speeds relating to a change of the relative position of the at least one sensor with respect to the reference and a current speed relating to a change of the relative position of the at least one sensor with respect to the reference. Forming the weighted average provides for computationally efficient removal of sudden jumps or instabilities.

The estimated corrected position may be used in downstream processes, e.g., as input to an incremental signal generator. Thus, according to some aspects, the method includes outputting S30 a compensated signal relating to the first corrected relative position. According to some further aspects, the method includes generating S40 an incremental signal based on compensated signal.

Concerning the time-dependence of the position with respect to the reference, the method may be enhanced further to address situations involving start-up, stops, and change of direction.

For instance, when increasing speed from stand-still, i.e., a start-up situation, the method may include outputting raw, uncompensated position values until a certain speed limit is reached. Stated differently, according to some aspects, the method includes evaluating S08 a change of the position, e.g., a speed, with respect to the reference with a predetermined criterion. Depending on the evaluation, a signal relating to a raw, uncompensated position or a corrected position may be output.

If a stored set of time stamped positions, such as table of positions and corresponding times, is used as a basis for determining the set parameter values of the parametrized approximation, as described above, the set of time stamped positions may not include any time stamped positions at start-up. In such cases, the speed value used to decide when the method outputs a signal relating to the estimated corrected position of the position with respect to the reference instead of a signal relating to the position with respect to the reference, i.e., raw, uncompensated position values, is not the same as the speed parameter, v, as described e.g., in relation to equations (1) to (3), above. One reason is that when starting from zero speed, the average speed may be undefined. For instance, in the above example of the magnetic ring encoder, when starting from zero speed, the average speed over the last two magnetic poles is undefined, because two poles have simply not been past at all. Instead, when starting from zero speed, the speed is calculated as the position change during a fixed time frame, i.e., a fixed number of sampled positions.

Once the speed has reached a sufficiently high speed, the method is not very sensitive to acceleration or deceleration. However, if the speed gets so low that it approaches zero again, the uncompensated, i.e., raw, position may be output again instead of the compensated position.

Thus, the predetermined criterion to which the change of the position with respect to the reference is compared may include the speed exceeding or falling below a predetermined threshold.

The predetermined criterion to which the change of the position with respect to the reference is compared may include the acceleration exceeding or falling below a predetermined threshold.

According to some aspects, the predetermined criterion to which the change of the position with respect to the reference is compared includes a difference between the first corrected relative position at the first time and a corresponding uncorrected relative position at the first time exceeding or falling below a predetermined threshold.

Position, speed, and acceleration thresholds may occur simultaneously in the predetermined criterion.

For example, when starting up, a set of time stamped relative positions may need to be stored S06 before the set of parameter values can be determined S10. Thus, in this example, the criterion may include that the speed needs to exceed a predetermined threshold at the same as the acceleration needs to fall below a predetermined threshold. When the set of parameter values have been determined, a corrected relative position can be estimated S20. The method may further include outputting S30 a compensated signal relating to the first corrected relative position.

According to some aspects, the method includes outputting S30 the compensated signal when the estimated corrected position equals the uncorrected position. By performing the switch from outputting a signal relating to the estimated corrected position at a time when the corrected position matches the uncorrected, i.e., raw, position, steps in the output can be avoided.

Then, if the estimated corrected position differs too much from the position indicated by the corresponding raw signal and/or an acceleration limit is exceeded and/or the speed is too low, the uncorrected, i.e., raw, position may be used as a basis for the output signal instead of the estimated corrected position. In other words, the predetermined criterion may include at least one of a difference between the estimated corrected position and the corresponding uncorrected position exceeding or falling below a predetermined threshold, the speed exceeding or falling below a predetermined threshold and the acceleration exceeding or falling below a predetermined threshold. The method may include outputting a signal relating to the uncorrected, i.e., raw, position with respect to the reference when the predetermined criterion is met. The method may include outputting S30 the compensated signal when the predetermined criterion is met.

Thus, to sum up, according to some aspects, the method further includes evaluating S08 a change of the relative position with a predetermined criterion. According to some aspects, the predetermined criterion includes a difference between the estimated corrected position and a corresponding uncorrected position exceeding or falling below a predetermined threshold. According to some aspects, the predetermined criterion includes a speed exceeding or falling below a predetermined threshold. According to some aspects, the predetermined criterion includes an acceleration exceeding or falling below a predetermined threshold.

Example embodiments of the present invention also relate to a computer program for signal error correction of a position signal relating to a relative position of at least one sensor with respect to a reference. The computer program includes computer program code which, when executed in a processor, causes the processor to carry out the method as described herein.

Figure 2:
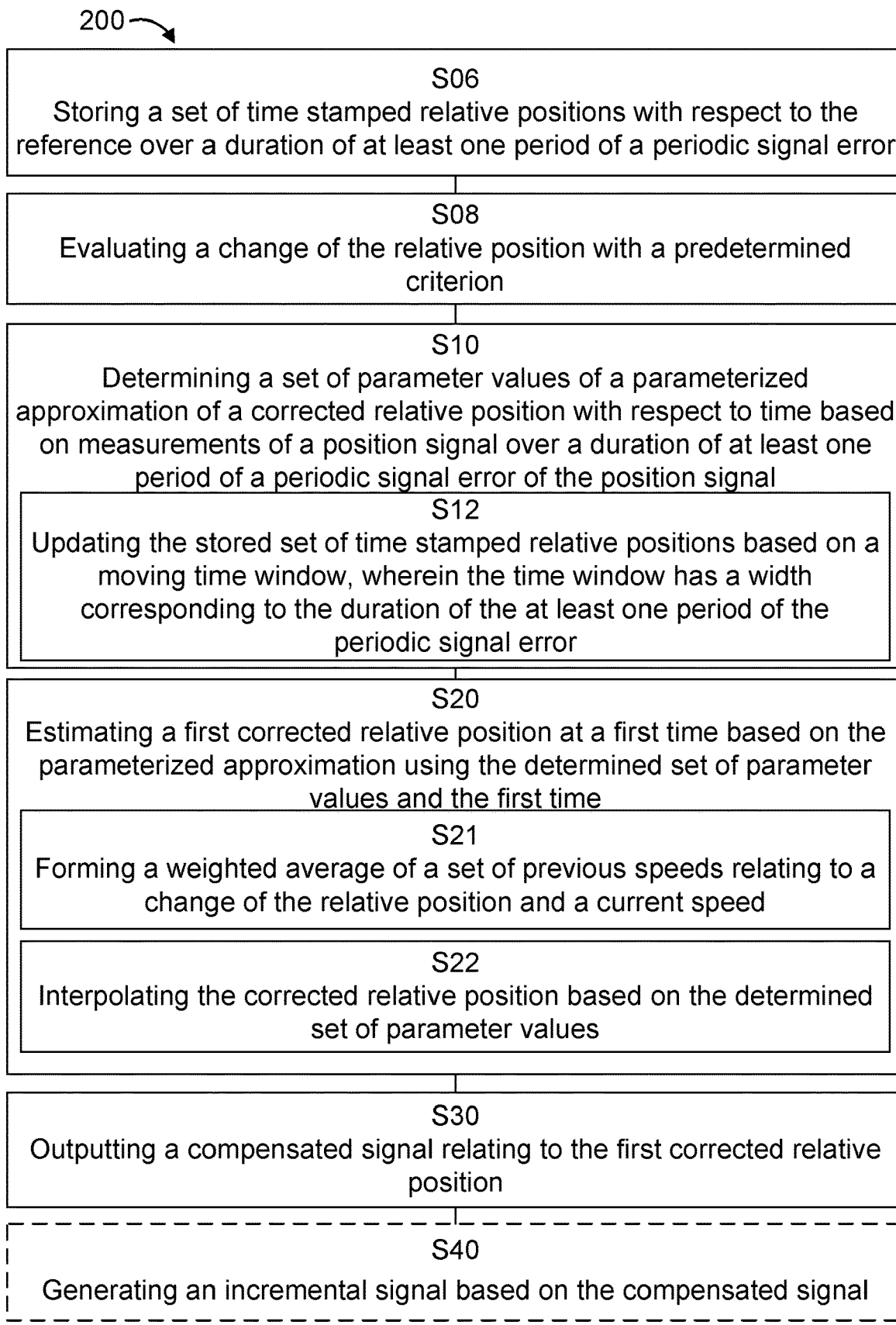
FIG. 2 illustrates examples of the method for signal error correction.

FIG. 2 illustrates examples of the method 200 for signal error correction. The illustrated examples may be suitable for use in relation to a magnetic ring encoder, e.g., a magnetic ring encoder as described in relation to FIG. 1 above and FIG. 5 below. The magnetic ring encoder may have a position reference in the form of a ring including alternating magnetic poles evenly distributed along a circumference of the ring.

The method is based on using a set of time stamped positions, e.g., in the form of a table including measured positions with respect to the reference, and corresponding times at which the positions were measured. Initially, there may not be any time stamped positions in the set of time stamped positions. This will typically be the case if, for instance, the magnetic ring encoder starts from a standstill and the reference begins to move, i.e., the ring starts to rotate, with respect to one or more magnetic sensors configured to measure the position in relation to the reference. The position with respect to the reference changes as the reference rotates with respect to the one or more magnetic sensors.

The method includes determining S10 a set of parameter values of a parameterized approximation of a corrected relative position with respect to time based on measurements of the position signal over a duration of at least one period of a periodic signal error of the position signal. The method further includes estimating S20 a first corrected relative position at a first time based on the parameterized approximation using the determined set of parameter values and the first time.

The method also includes outputting S30 a compensated signal relating to the first corrected relative position.

In the case of no stored time stamped positions in the set of time stamped positions, which typically will be the case when applying the method at start-up of the magnetic ring encoder, the set of parameters of the parametrized approximation cannot be determined. Thus, the method includes storing S06 a set of time stamped relative positions with respect to the reference over a duration of at least one period of the periodic signal error.

In the case of the magnetic ring encoder, the position is measured by the one or more sensors sweeping over the magnetic poles of the magnetic ring as the magnetic ring rotates with respect to the one or more sensors. The one or more sensors repeatedly register a signal in the form of magnetic pulses. When there is an external magnetic field perturbation or if the axis about which the magnetic ring rotates is slightly misaligned with respect to the one or more sensors, the measured signal will vary periodically over the magnetic north and south poles. The periodic variation over a magnetic pole pair corresponds to a periodic signal error, which will indicate a position of the one or more sensors with respect to the magnetic ring that is slightly different from what could be expected in an ideal case, e.g., a perfectly aligned rotational axis and no external magnetic field perturbation. Thus, the period of the periodic signal error extends over a magnetic pole pair, i.e., two magnetic poles. In addition to reducing the periodic signal error over a magnetic pole pair, the illustrated example further reduces recurrent signal errors of half the period.

While the method may store S06 a set of time stamped relative positions of one duration of the periodic signal error, the method will be illustrated here as including a step of storing S06 a set of time stamped relative positions over a duration of a periods of the signal error over a magnetic pole pair, i.e., a period of a magnetic north pole and a magnetic south pole.

Specifically, in the case of a magnetic ring encoder, the length of a magnetic north-south pole pair is divided into N−1 segments. Thus, the set of time stamped positions may be arranged to receive N time stamped positions, e.g., in the form of a table with N evenly distributed position values and a table with the N corresponding times, or joined in a single table with two rows or column storing pairs of position values and corresponding times. The first and the last table entries are one magnetic pole pair period apart.

As the method is initiated, the set of time stamped positions is gradually filled with N time-stamped positions. During this time, raw, uncorrected data is output. In other words, the relative position of at least one sensor with respect to the reference must have moved a distance corresponding to a spatial extent of a magnetic pole pair before the set of parameter values can be determined S10, a first corrected relative position at a first time can be estimated S20, and a compensated signal relating to the first corrected relative position can be output S30. Stated differently, according to some aspects, the method may include evaluating S08 a change of the relative position with respect to the reference with a predetermined criterion. According to some further aspects, the predetermined criterion includes a difference between the estimated corrected position and a corresponding uncorrected position exceeding or falling below a predetermined threshold. In this example, the predetermined threshold is at least one magnetic pole pair period of the periodic signal error.

As described in relation to FIG. 1 above, the change of the position with respect to the reference may need to reach a certain speed before a corrected position is determined. Thus, according to some aspects, the predetermined criterion includes a speed exceeding or falling below a predetermined threshold.

Once the distance and speed criteria have been met, the set of parameter values of a parameterized approximation of the position with respect to time can be determined S10. According to some aspects, determining S10 the set of parameter values is performed using regression. For example, the parametrized approximation includes a linear approximation of the position with respect to time. In other words, the parametrized approximation takes the form:

$$s = s_0 + v \cdot t + \text{optional terms} \qquad (4)$$

in which s denotes a corrected relative position at a second time t, $s_0$ denotes an initial relative position with respect to the reference, and v denotes the average speed at the second time t. The parametrized approximation for the corrected relative position s is thus the expression on the right-hand side of equation (4). The parametrized may take any of the forms described by equations (1) to (3), above. The set of parameter values that are determined S10 comprises $s_0$ and v.

With the set of parameter values determined, a corrected value for the position can be estimated. According to some preferred aspects, the method includes interpolating S22 the corrected relative position based on the determined set of parameter values. In particular, with a current time value, such as the last recorded time or a future time with respect to a time when a method step was initiated, a current position value can be obtained by inserting the current time value into equation (4). Thus, estimating S20 the first corrected relative position is further based on a current time. Stated differently, the first time may include a current time.

The time it takes for the one or more sensors of the magnetic ring encoder to sweep across a magnetic pole pair may be longer than the time interval between sampled positions. In other words, the sampling frequency of the one or more sensors may be so high that several samples are measured by a sensor over the same magnetic pole as the magnetic reference moves with respect to the sensor. Until the position of one or more sensors have moved a step with respect to the magnetic ring encoder, corresponding to a distance of a magnetic pole pair period of the periodic signal error divided by the number of segments, N−1, the current parameter values, $s_0$ and v, are reused when continuously estimating S20 the first corrected relative position based on the current time.

As the time window of the set of time stamped positions have moved one step forward the set of time stamped positions are updated by adding the position and time of the latest magnetic pole pair, and the oldest time stamped position is removed from the set of time stamped positions. In other words, the method includes updating S12 the stored set of time stamped relative positions based on a moving time window, in which the time window has a width corresponding to the duration of the at least one period of the periodic signal error.

The method then determines an updated set of parameter values, $s_0$ and v, of the parameterized approximation of the position with respect to time using the updated set of time stamped positions. Future corrected positions with respect to the reference are then estimated based on the parameterized approximation using the updated set of parameter values. The method thereby continuously updates the set of parameter values, $s_0$ and v.

Depending on the magnetic ring encoder and the intended application, the method may further include evaluating S08 a change of the relative position with a predetermined criterion, in which, according to some aspects, the predetermined criterion includes at least one of a difference between the first corrected relative position at the first time and a corresponding uncorrected relative position at the first time exceeding or falling below a predetermined threshold, a speed exceeding or falling below a predetermined threshold, or an acceleration exceeding or falling below a predetermined threshold. The method may also include calculating the speed, v, as a weighted average between an old value of the speed and a speed calculated over the last pole pair, ds/dt.

According to some aspects, the method further includes generating S40 an incremental signal based on the compensated signal.

The examples of the disclosed method illustrated in relation to FIG. 2 may also be implemented partially or completely in software. In other words, the examples of the disclosed method illustrated in relation to FIG. 2 may be implemented in a computer program for signal error correction of a position signal relating to a relative position of at least one sensor with respect to a reference. The computer program includes computer program code which, when executed in a processor, causes the processor to perform the method as described above in relation to FIG. 2.

Figure 3:
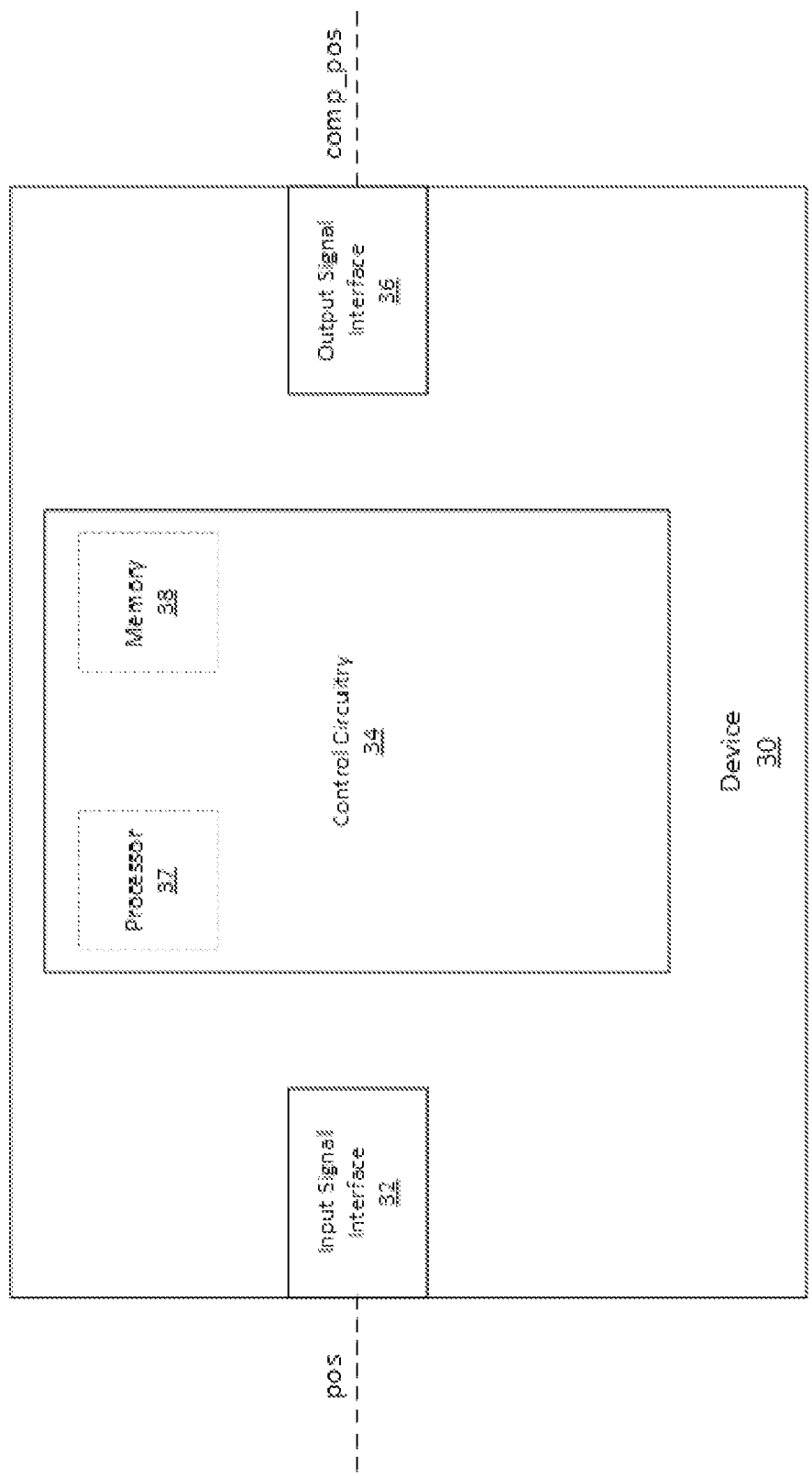
FIG. 3 illustrates a device for signal error correction.

FIG. 3 illustrates a device 30 for signal error correction of a position signal relating to a relative position of at least one sensor with respect to a reference. The device 30 includes an input signal interface 32 configured to receive the position signal.

The device 30 further includes control circuitry 34, which is configured to determine a set of parameter values of a parameterized approximation of a corrected relative position with respect to time based on measurements of the position signal over a duration of at least one period of a periodic signal error of the position signal. The control circuitry is further configured to estimate a first corrected relative position at a first time based on the parameterized approximation using the determined set of parameter values and the first time.

The device 30 also includes an output signal interface 36 configured to output a compensated signal relating to the first corrected relative position. The device 30 is thereby capable of performing the disclosed method, and has the technical effects and advantages of the method. The input signal interface and/or output signal interface may by implemented at least partially as electronic and/or optical circuitry. According to some aspects, the control circuitry 34 includes a processor 37 and a memory 38. The memory 38 is configured to store a computer program implementing the method, as described herein, thereon. The processor 37 is configured to execute the computer program stored on the memory 38.

FIG. 4 illustrates an encoder 400 for signal error correction of a position signal relating to a relative position of at least one sensor with respect to a reference 405. The encoder 400 includes a sensor arrangement 410 having at least one sensor 420. The sensor arrangement 410 is configured to measure, by the at least one sensor (420, 520), the relative position. The at least one sensor may be configured to measure a magnetic, an optical, an inductive, a capacitive position signal, etc.

The sensor arrangement 410 is further configured to output the position signal, pos, based on the measured relative position. In the case of magnetic ring encoders, alternating magnetic poles of the magnetic ring will serve as a reference. The position with respect to the reference will be related to how many magnetic poles the one or more sensors have passed over a given time frame.

The encoder 400 further includes a device 40 for signal error correction of the position signal. The device 40 includes an input signal interface 42 configured to receive the position signal, pos, from the sensor arrangement 410. The device 40 further includes control circuitry 44. The control circuitry is configured to determine a set of parameter values of a parameterized approximation of a corrected relative position with respect to time based on measurements of the position signal over a duration of at least one period of a periodic signal error of the position signal. The control circuitry is also configured to estimate a first corrected relative position at a first time based on the parameterized approximation using the determined set of parameter values and the first time. The encoder 400 also includes an output signal interface 46 configured to output a compensated signal, comp_pos, relating to the first corrected relative position.

The sensor arrangement may include further processing circuitry, which processes the signals measured by the one or more sensors 420 before the information is passed on to the device 40 for signal error correction, e.g., as illustrated in relation to FIG. 5.

According to some aspects, the device 40 is implemented in software, i.e., as a computer program. In this case, the control circuitry 44 of the device can be regarded as part of the encoder 400, e.g., part of the sensor arrangement. The input signal interface 42 and/or the output signal interface 46 may also be implemented at least partially in software.

According to some aspects, the parametrized approximation includes a linear relationship of the corrected relative position (s) with respect to a second time (t). According to some further aspects, the linear relationship is determined by a sum of an initial relative position, $s_0$, at an initial zero time, and a product of an average speed (v) of the relative position at the second time (t) and the second time (t), $s=s_0+v \cdot t$.

According to some aspects, the encoder further includes a signal generator 430 configured to receive the compensated signal, comp_pos, from the device 40. The signal generator 430 is further configured to generate an incremental output signal, inc, based on the received compensated signal, comp_pos. The signal generator 430 is also configured to output the generated incremental output signal, inc. The encoder 400 is thereby configured to provide an error corrected incremental output signal based on the measurements of the sensors. In the case of a magnetic ring encoder, the encoder 400 is able to provide an error corrected incremental output signal based a measured pole pair.

FIG. 5 illustrates examples of encoders for signal error correction of a position signal relating to a relative position of at least one sensor with respect to a reference. In particular, FIG. 5 illustrates examples of magnetic ring encoders for signal error correction, in which the method is implemented in the context of magnetic ring encoders.

The encoder 500 includes a sensor arrangement 510, having two sensors 520. The two sensors 520 are configured to measure a magnetic signal.

The encoder includes a magnetic ring 505. The magnetic ring includes alternating magnetic poles distributed evenly along a circumference of the magnetic ring. The magnetic ring also includes a gap at one or more positions along the circumference where no magnetic poles are present.

The magnetic ring is further configured to rotate about an axis. The magnetic ring is thereby configured to rotate, i.e., move, with respect to the two sensors. The two sensors are arranged with respect to a magnetic ring of the encoder 500 such that the at least one sensor is always able to measure a magnetic signal from a magnetic pole of the magnetic ring 505. As the magnetic ring rotates, one of the sensors will eventually encounter the gap and momentarily be unable to measure a magnetic signal. By having two sensors, the sensors 520 can be spatially separated to ensure that at least one of the two sensors is always able to measure a magnetic signal of the magnetic ring 505. The magnetic ring 505 thereby serves as a reference to a position, in which the position relates to how much the magnetic ring has rotated, e.g., with respect to the two sensors 520.

As the magnetic ring performs a rotational motion, the measured magnetic signal over a magnetic north or south pole will depend on the change of the magnetic north and south poles passing the two magnetic sensors 520. In other words, the reference is the magnetic ring 505, in particular one or more of the magnetic poles of the magnetic ring. When a magnetic sensor is first activated, a zero distance can be established, with distance being measured as a, possibly cumulative, rotation of the magnetic ring with respect to the magnetic sensor. When the magnetic ring is rotated with respect to a magnetic sensor, the magnetic signal measured by the magnetic sensor relates to the rotation of the magnetic ring with respect to the magnetic sensor. In other words, the measured change in the magnetic field corresponds to a travelled distance, i.e., a relative rotation, with respect to the reference. However, sources of errors, such as external constant magnetic fields or slight misalignment of the rotational axis, can cause the measured magnetic signal to deviate from an expected behavior associated with the underlying rotation, i.e., change of position with respect to the reference, which can be seen as an error. For instance, if there is an external constant magnetic field, the measurement signal may be enhanced over magnetic north poles and reduced over magnetic south poles, or vice versa. As the magnetic ring moves from, e.g., a magnetic north pole to the next magnetic north pole, a sensor is expected to experience a periodic error of the same length, i.e., of the same duration. An interpolation for generating a downstream incremental output signal will then experience an interpolation error over a magnetic pole pair. In other words, the magnetic signal is, for example, measured over a duration of one period of the periodic signal error.

Thus, the sensor arrangement 510 is configured to measure, by the two sensors 520, a position with respect to the reference 505, i.e., the relative position of the at least one sensor with respect to the reference. The sensor arrangement 510 is configured to convert the measured signals from the respective sensors 520 to digital signals via an analog-to-digital converter. The analog-to-digital converter determines the frequency at which the position with respect to the reference is sampled.

The digital signals are transformed from their nearly periodic form to a corresponding inverse trigonometric value, e.g., arctan, and subsequently passed on to a merging module, e.g., a multiplexer, mux, for merging the two signals into the position signal, pos. The sensor arrangement is further configured to output the position signal, pos, based on the measured relative position.

The encoder 500 further includes a device 50 for signal error correction of the position signal. The device 50 includes an input signal interface configured to receive the position signal, pos, from the sensor arrangement 510. The device 50 further includes control circuitry. The control circuitry is configured to determine a set of parameter values of a parameterized approximation of a corrected relative position with respect to time based on measurements of the position signal over a duration of at least one period of a periodic signal error of the position signal.

According to some aspects, the parametrized approximation includes a linear relationship of the corrected relative position, s, with respect to a second time, t. According to some further aspects, the linear relationship is determined by a sum of an initial relative position, $s_0$, at an initial zero time, and a product of an average speed, v, of the relative position at the second time, t and the second time, $s=s_0+v \cdot t$.

The control circuitry is further configured to estimate a first corrected relative position at a first time based on the parameterized approximation using the determined set of parameter values and the first time.

The device 50 thus takes raw, uncorrected position data in the form of the received signal, pos, and estimates a corrected position with respect to the reference, i.e., the magnetic ring 505. The corrected position with respect to the reference is used as a basis for generating an incremental output signal as described below.

The encoder further includes an output signal interface configured to output a compensated signal, comp_pos, relating to the first corrected relative position.

The encoder 500 also includes a signal generator 530, which is configured to receive the compensated signal, comp_pos, from the device 50 for signal error correction. The signal generator 530 is further configured to generate an incremental output signal, inc, based on the received compensated signal, comp_pos. The signal generator 530 is also configured to output the generated incremental output signal, inc.

The encoder 500 is thereby configured to output an incremental output signal which has been corrected for the periodic signal error measured by the two sensors 520.

According to some aspects, the device 50 is implemented in software, i.e., as a computer program for signal error correction of a signal relating to a position with respect to a reference, as described herein. In this case, the control circuitry of the device 50 can be regarded as part of the encoder 500, e.g., part of the sensor arrangement 510. The input signal interface and/or the output signal interface of the device 50 may also be implemented at least partially in software.

What is claimed is:

1. A method for signal error correction of a position signal relating to a relative position of at least one sensor with respect to a position reference, comprising:
    determining a set of parameter values of a parameterized approximation of a corrected relative position with respect to time based on measurements of the position signal over a duration of at least one period of a periodic signal error of the position signal;
    estimating a first corrected relative position at a first time based on the parameterized approximation using the determined set of parameter values and the first time, the estimating including forming a weighted average of a set of previous speeds relating to a change of the relative position of the at least one sensor with respect to the position reference and a current speed relating to a change of the relative position of the at least one sensor with respect to the position reference; and
    outputting a compensated signal related to the first corrected relative position.

2. The method according to claim 1, wherein the first time includes a current time.

3. The method according to claim 1, wherein the estimating includes interpolating the corrected relative position based on the determined set of parameter values.

4. The method according to claim 1, further comprising storing a set of time stamped relative positions with respect to the position reference over a duration of at least one period of the periodic signal error.

5. The method according to claim 4, further comprising updating the stored set of time stamped relative positions based on a moving time window, wherein the time window has a width corresponding to a duration of the at least one period of the periodic signal error.

6. The method according to claim 1, wherein the parametrized approximation includes a linear relationship of the corrected relative position with respect to a second time.

7. The method according to claim 6, wherein the linear relationship is determined by a sum of an initial relative position at an initial zero time, and a product of an average speed of the relative position at the second time and the second time.

8. The method according to claim 1, wherein the determining the set of parameter values is performed using regression.

9. The method according to claim 1, further comprising outputting a compensated signal relating to the first corrected relative position.

10. The method according to claim 9, further comprising generating an incremental signal based on the compensated signal.

11. The method according to claim 1, further comprising evaluating a change of the relative position with a predetermined criterion.

12. The method according to claim 11, wherein the predetermined criterion includes a difference between the estimated first corrected relative position at the first time and a corresponding uncorrected relative position at the first time exceeding or falling below a predetermined threshold.

13. The method according to claim 11, wherein the predetermined criterion includes a speed exceeding or falling below a predetermined threshold.

14. The method according to claim 11, wherein the predetermined criterion includes an acceleration exceeding or falling below a predetermined threshold.

15. A non-transitory computer-readable storage medium having stored therein instructions which, when executed by a processor, cause the processor to perform a method for signal error correction of a position signal relating to a relative position of at least one sensor with respect to a position reference, comprising:
    determining a set of parameter values of a parameterized approximation of a corrected relative position with respect to time based on measurements of the position signal over a duration of at least one period of a periodic signal error of the position signal;
    estimating a first corrected relative position at a first time based on the parameterized approximation using the determined set of parameter values and the first time, the estimating including forming a weighted average of a set of previous speeds relating to a change of the relative position of the at least one sensor with respect to the position reference and a current speed relating to a change of the relative position of the at least one sensor with respect to the position reference; and
    outputting a compensated signal related to the first corrected relative position.

16. A device for signal error correction of a position signal relating to a relative position of at least one sensor with respect to a position reference, comprising:
    an input signal interface configured to receive the position signal;
    control circuitry configured to:
        determine a set of parameter values of a parameterized approximation of a corrected relative position with respect to time based on measurements of the position signal over a duration of at least one period of a periodic signal error of the position signal; and
        estimate a first corrected relative position at a first time based on the parameterized approximation using the determined set of parameter values and the first time and to form a weighted average of a set of previous speeds relating to a change of the relative position of the at least one sensor with respect to the position reference and a current speed relating to a change of the relative position of the at least one sensor with respect to the position reference; and
    an output signal interface configured to output a compensated signal relating to the first corrected relative position.

17. The device according to claim 16, wherein the control circuitry includes a processor and a memory, the memory configured to store a computer program including instructions which, when executed by the processor, cause the processor to perform a method for signal error correction of the position signal relating to the relative position of the at least one sensor with respect to the position reference, including:
    determining the set of parameter values of the parameterized approximation of the corrected relative position with respect to the time based on measurements of the position signal over the duration of the at least one period of the periodic signal error of the position signal; and estimating the first corrected relative position at the first time based on the parameterized approximation using the determined set of parameter values and the first time.

18. An encoder for signal error correction of a position signal relating to a relative position of at least one sensor with respect to a position reference, comprising:
- a sensor arrangement including the least one sensor and configured to measure, via the at least one sensor, the relative position and to output the position signal based on the measured relative position;
- a signal error correction device adapted for signal error correction of the position signal, the signal error correction device including:
  - an input signal interface configured to receive the position signal from the sensor arrangement; and
  - control circuitry configured to:
    - determine a set of parameter values of a parameterized approximation of a corrected relative position with respect to time based on measurements of the position signal over a duration of at least one period of a periodic signal error of the position signal; and
    - estimate a first corrected relative position at a first time based on the parameterized approximation using the determined set of parameter values and the first time and to form a weighted average of a set of previous speeds relating to a change of the relative position of the at least one sensor with respect to the position reference and a current speed relating to a change of the relative position of the at least one sensor with respect to the position reference; and
  - an output signal interface configured to output a compensated signal relating to the first corrected relative position.

19. The encoder according to claim 18, wherein the parametrized approximation includes a linear relationship of the corrected relative position with respect to a second time.

20. The encoder according to claim 19, wherein the linear relationship is determined by a sum of an initial relative position, at an initial zero time, and a product of an average speed of the relative position at the second time and the second time.

21. The encoder according to claim 18, further comprising a signal generator configured to receive the compensated signal from the signal error correction device, to generate an incremental output signal based on the received compensated signal, and output the generated incremental output signal.

* * * * *